(12) United States Patent
Chen et al.

(10) Patent No.: US 9,111,752 B1
(45) Date of Patent: Aug. 18, 2015

(54) ELECTROSTATIC DISCHARGE PROTECTION DEVICE

(71) Applicant: VIA TECHNOLOGIES, INC., New Taipei (TW)

(72) Inventors: Ke-Yuan Chen, New Taipei (TW); Jyh-Fong Lin, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/696,785

(22) Filed: Apr. 27, 2015

Related U.S. Application Data

(62) Division of application No. 13/666,509, filed on Nov. 1, 2012, now Pat. No. 9,048,098.

(30) Foreign Application Priority Data

Nov. 9, 2011 (TW) .............................. 100140851 A

(51) Int. Cl.
*H02H 9/00* (2006.01)
*H01L 27/02* (2006.01)

(52) U.S. Cl.
CPC ........ *H01L 27/0262* (2013.01); *H01L 27/0248* (2013.01); *H01L 27/0255* (2013.01)

(58) Field of Classification Search
CPC ....................................... H01L 27/04–27/3297
See application file for complete search history.

(56) References Cited

U.S. PATENT DOCUMENTS

| | | | |
|---|---|---|---|
| 7,405,445 B2 | 7/2008 | Huang et al. | |
| 7,518,843 B2 | 4/2009 | Wu et al. | |
| 7,605,431 B2 * | 10/2009 | Chen | 257/370 |
| 7,696,580 B2 * | 4/2010 | Chen et al. | 257/370 |
| 8,564,065 B2 | 10/2013 | Donovan et al. | |
| 8,780,511 B2 * | 7/2014 | Moon | 361/56 |
| 2003/0193765 A1 | 10/2003 | Kitano | |
| 2004/0155291 A1 * | 8/2004 | Okushima | 257/355 |
| 2004/0178455 A1 | 9/2004 | Kojima | |
| 2005/0045955 A1 | 3/2005 | Kim et al. | |
| 2005/0280091 A1 | 12/2005 | Huang et al. | |
| 2007/0120196 A1 | 5/2007 | Chen et al. | |
| 2007/0146953 A1 | 6/2007 | Ono | |
| 2008/0062607 A1 * | 3/2008 | Cheng et al. | 361/113 |

(Continued)

FOREIGN PATENT DOCUMENTS

TW 200601544 1/2006

*Primary Examiner* — Matthew W Such
*Assistant Examiner* — Ali Naraghi
(74) *Attorney, Agent, or Firm* — McClure, Qualey & Rodack, LLP

(57) ABSTRACT

An electrostatic discharge protection device having a P-type substrate, a common N-well formed in the P-type substrate, a common N-doped region formed in the first common N-well, wherein the common N-doped region is electrically connected to a reference voltage node. The device further has a common P-doped region formed in the common N-well, wherein the common P-doped region surrounds the common N-doped region, the common P-doped region and the common N-well form a common diode, a plurality of peripheral N-wells formed in the P-type substrate and surrounding the common N-well, each of the peripheral N-wells comprising a P-type doped region and a N-type doped region, wherein the P-type doped region is electrically connected to one of a plurality of I/O terminals, and a circular P-doped region formed in the P-type substrate and disposed between the common N-well and the peripheral N-wells, and the circular P-doped region surrounding the common N-well.

6 Claims, 17 Drawing Sheets

(56) References Cited

U.S. PATENT DOCUMENTS

2008/0067601 A1* 3/2008 Chen .......................... 257/361
2008/0316659 A1* 12/2008 Oguzman et al. ............. 361/56
2010/0109063 A1 5/2010 Hayashida
2010/0214705 A1* 8/2010 Kim et al. .................... 361/56
2013/0049067 A1* 2/2013 Chen et al. ................... 257/173

* cited by examiner

ELECTROSTATIC DISCHARGE PROTECTION DEVICE

CROSS REFERENCE TO RELATED APPLICATIONS

This application is a divisional of pending U.S. application Ser. No. 13/666,509, filed on Nov. 1, 2012, which claims the full benefit and priority of Taiwan Patent Application Serial No. 100140851, filed Nov. 9, 2011, and incorporates the entire contents of said applications herein.

BACKGROUND OF THE INVENTION

1. Field of the Invention

The present invention relates to electrostatic discharge protection devices, and in particular relates to electrostatic discharge protection device structures and layouts.

2. Description of the Related Art

An electrostatic discharge (ESD) event happens when electrostatic charges move from one surface to another. In VLSI circuits, electrostatic current may cause damage to semiconductor junctions, metal parts, and gate structures. FIG. 1 shows a conventional ESD protection device. In FIG. 1, a zener diode Z1 serves as a conventional ESD protection device for protecting a circuit C1. The cathode of the zener diode Z1 is connected to an input/output I/O of the circuit C1, and the anode of the zener diode Z1 is connected to a reference node VSS of the circuit C1. When an electrostatic discharge (ESD) event occurs at the input/output I/O, a high voltage potential larger than a junction breakdown voltage of the zener diode Z1 sets the zener diode Z1 to forward biased, and creates a current path dissipating ESD charges to the reference node VSS.

However, with the advancement of semiconductor fabrication technology, the breakdown voltages of sub-80 nm gate dielectrics are close to or less than 3~4 V, and the trigger voltage of a conventional zener diode is around 9V. As a result, an ESD event can occur and damage the gate dielectrics of the VLSI circuit before the activation of the zener diode. A novel ESD protection device with a lower trigger voltage and lower holding voltage is desired.

BRIEF SUMMARY OF THE INVENTION

The detailed description is given in the following embodiments with reference to the accompanying drawings. The disclosure includes an electrostatic discharge protection device, comprising a P-type substrate set as floating; a first common N-well formed in the P-type substrate; a first common N-doped region formed in the first common N-well; a first common P-doped region formed in the first common N-well; a second common N-well formed in the P-type substrate; a second common N-doped region formed in the second common N-well and electrically connected to a reference voltage node; a second common P-doped region formed on the second common N-well; a third common P-doped region formed between the first common N-well and the second common N-well on the P-type substrate, and the third common N-doped region being electrically connected to the first common N-doped region and the second common P-doped region; and a plurality of peripheral N-wells are formed in the P-type substrate. Each of the peripheral N-wells comprises a P-type doped region and a N-type doped region, wherein the P-type doped region is electrically connected to one of a plurality of I/O terminals, and the N-type doped region is electrically connected to the first common P-doped region and a bus.

The disclosure further teaches an electrostatic discharge protection device, comprising a P-type substrate set as floating; a common N-well formed in the P-type substrate; a common N-doped region formed in the first common N-well and electrically connected to a reference voltage node; a common P-doped region is formed in the common N-well, wherein the common P-doped region surrounds the common N-doped region, and the common P-doped region and the common N-well form a common diode; a plurality of peripheral N-wells formed in the P-type substrate and surrounding the common N-well, and each of the peripheral N-well comprising a P-type doped region and an N-type doped region, each of the P-type doped regions being electrically connected to one of a plurality of I/O terminals; and a circular P-doped region is formed in the P-type substrate and disposed between the common N-well and the peripheral N-wells. The circular P-doped region surrounds the common N-well. The common P-doped region, the circular P-doped region, and the N-type doped regions are electrically connected to a bus.

The disclosure further comprises an electrostatic discharge protection device, comprising: a P-type semiconductor substrate set as floating; a first N-well and a second N-well formed in the P-type substrate; a first P-doped region and a second P-doped region formed in the first N-well and the second N-well respectively, wherein the first N-well and the first P-doped region form a first diode, and the second N-well and the second P-doped region form a second diode; a first N-doped region and a second N-doped region formed in the first N-well and the second N-well respectively; and a third P-doped region is formed in the P-type substrate. The third P-doped region is disposed between the first N-well and the second N-well, and the third P-doped region is electrically connected to the first N-doped region and the second P-doped region.

The disclosure further comprises an electrostatic discharge protection device, comprising: a P-type semiconductor substrate set as floating; a first N-well and a second N-well formed in the P-type substrate; a first P-doped region and a second P-doped region formed in the first N-well and the second N-well respectively, wherein the first N-well and the first P-doped region form a first diode, the second N-well and the second P-doped region form a second diode, and the first P-doped region is electrically connected to an I/O terminal; a first N-doped region and a second N-doped region formed in the first N-well and the second N-well respectively, wherein the second N-doped region is electrically connected to a reference voltage node; and a gate structure formed on the P-type substrate, wherein the gate structure is disposed between the first N-well and the second N-well, and the gate structure is electrically connected to the first N-doped region and the second P-doped region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
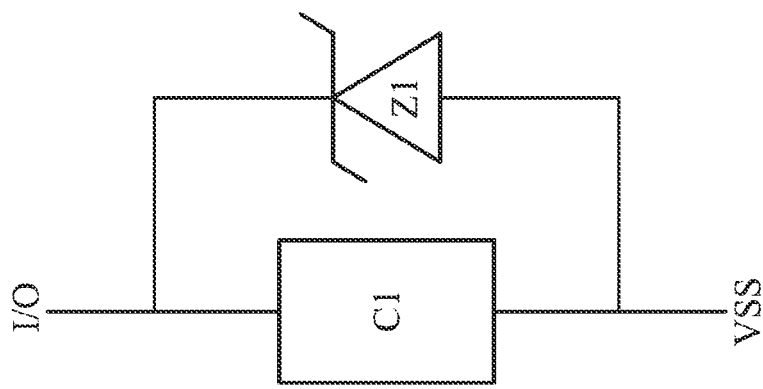
FIG. 1 is a schematic view of a conventional ESD protection circuit Z1 protecting circuit C1.
Figure 2A:
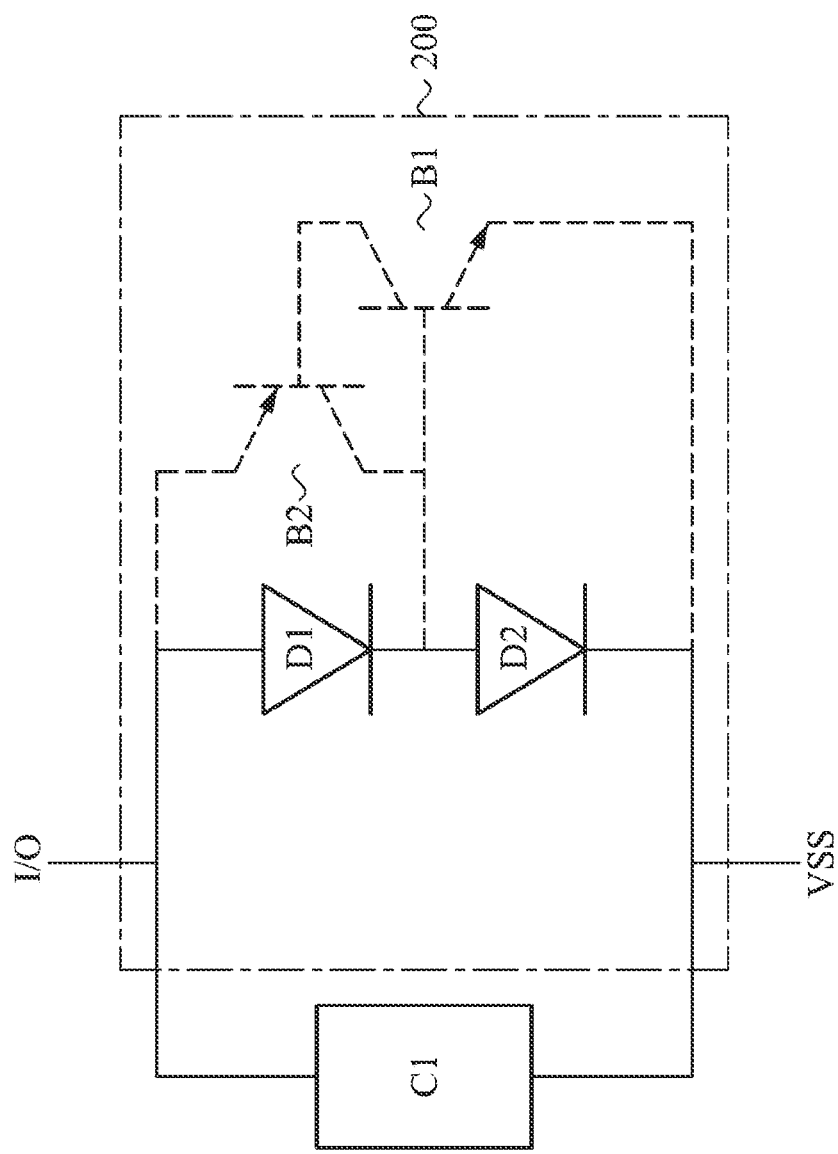
FIG. 2A is an equivalent circuit diagram showing an ESD protection circuit 200 protecting circuit C1.
Figure 2B:
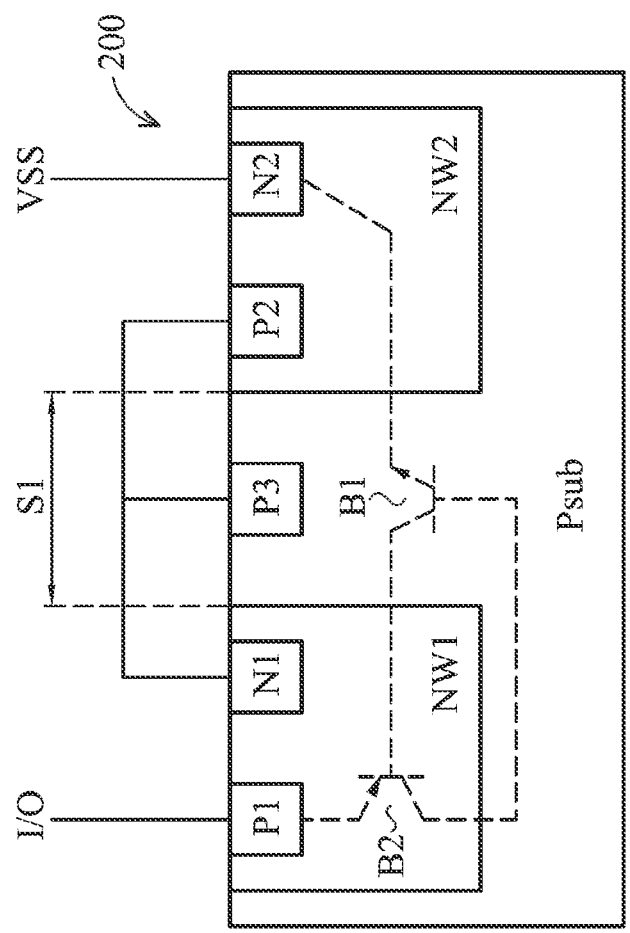
FIG. 2B is a cross-sectional view of the ESD protection circuit 200.

FIG. 2A is an equivalent circuit diagram showing an ESD protection circuit 200 protecting a circuit C1, and FIG. 2B is a cross-sectional view of the ESD protection circuit 200.

As shown in FIG. 2B, the ESD protection circuit 200 comprises a P-type substrate Psub, a first N-well NW1, a second N-well NW2, and a third P-doped region P3. The P-type substrate Psub is set as floating, which means the P-type substrate Psub is not electrically connected to ground node. The first N-well NW1, the second N-well NW2, and the third P-doped region P3 are formed in the P-type substrate Psub. Both of the first N-well NW1 and the second N-well NW2 comprise a pair of high doped regions with opposite doping type. The first N-well NW1 comprises a first P-doped region P1 and a first N-doped region N1, and the first N-well NW1 and the first P-doped region P1 form a first diode D1, which is shown in FIG. 2A. The second N-well NW2 comprises a second P-doped region P2 and a second N-doped region N2, and the second N-well NW2 and the second P-doped region P2 form a second diode D2, which is shown in FIG. 2A. The first N-doped region N1, the second P-doped region P2, and the third P-doped region P3 are electrically connected.

In one embodiment of the invention, the first P-doped region P1 is connected to an input/output terminal I/O, and the second N-doped region N2 is connected to a voltage reference node VSS. The first N-well NW1 and the second N-well NW2 are geometrically close to each other, in order to form two parasitic BJTs B1 and B2, as shown in FIGS. 2A and 2B. Emitter, base, and collector of parasitic BJT B1 are respectively formed by the second N-well NW2, the P-type substrate Psub, and the first N-well NW1. Emitter, base, and collector of parasitic BJT B2 are respectively formed by the first P-doped region P1, the first N-well NW1, and the P-type substrate Psub. The collector of the parasitic BJT B1 and the base of the parasitic BJT B2 are electrically connected, and the base of the parasitic BJT B1 is electrically connected to the collector of the parasitic BJT B2, as shown in FIG. 2B. A distance S1 between the first N-well NW1 and the second N-well NW2 could be regarded as the thickness of the Base of the parasitic BJT B1. When the thickness of the base is not short enough, it may result in a small beta gain of the parasitic BJT B1 and the ESD protection circuit 200 may not function properly. In one preferred embodiment, the distance S1 between the first N-well NW1 and the second N-well NW2 is less than 5 µm.

The ESD protection circuit 200 is in parallel with the circuit C1 under protection shown in FIG. 2A. Two ends of the circuit C1 under protection are electrically connected to the input/output terminal I/O and the reference voltage node VSS respectively. The circuit C1 under protection may be but not limited to an integrated circuit formed by VLSI fabricating technology. The first diode D1 and the second diode D2 are connected in series. The anode of the first diode D1 is connected to the input/output terminal I/O, and the cathode of the first diode D1 is connected to the anode of the second diode D2. The cathode of the second diode D2 is connected to the reference voltage node VSS. The emitter of the parasitic BJT B1 is electrically connected to the reference voltage node VSS, and the collector of the parasitic BJT B1 is electrically connected to the base of the parasitic BJT B2. The base of the parasitic BJT B1 is electrically connected to the collector of the parasitic BJT B2. The emitter of the parasitic BJT B2 is connected to the input/output terminal I/O.

When an ESD event occurs between the input/output terminal I/O and the reference voltage node VSS, and the voltage of the input/output terminal I/O is higher than the reference voltage node VSS, the first and second diodes D1 and D2 are forward biased and are functionalized as a current path to discharge the electrostatic charges away from the circuit C1 under protection. A bias generated by the ESD event is applied to the base of the parasitic BJT B1 to trigger ON the parasitic BJT B1, and then the parasitic BJT B2 is successively triggered to ON. The parasitic BJTs B1 and B2 together serve as an additional current path with lower impedance to discharge the electrostatic charges away from the circuit C1 under protection. The holding voltage of the ESD protection device 200 becomes lower when the parasitic BJTs B1 and B2 are triggered to ON (activated). The voltage difference between the input/output terminal I/O and the reference voltage node VSS (i.e. the holding voltage of the ESD protection device 200), is equal to the sum of the voltage difference between the collector and the emitter of the parasitic BJT B1 and the voltage difference between the emitter and the base of the parasitic BJT B2.

The above embodiment utilizes the floating P-type substrate Psub and the triggered parasitic BJTs B1 and B2 to effectively reduce the effective impedance and holding voltage of the ESD protection device 200, thereby improving efficiency and reliability. Furthermore, due to the P-type substrate Psub not being connected to any ground node, and the first and second diodes D1 and D2 are separately disposed in the first N-well and the second N-well, the ESD protection circuit 200 of the embodiment will not influenced by the Darling effect. An additional current path formed by parasitic BJTs B1 and B2 further makes the ESD protection circuit 200 more endurable against high discharging current comparing with conventional ESD protection device under the same layout area.

Figure 3A:
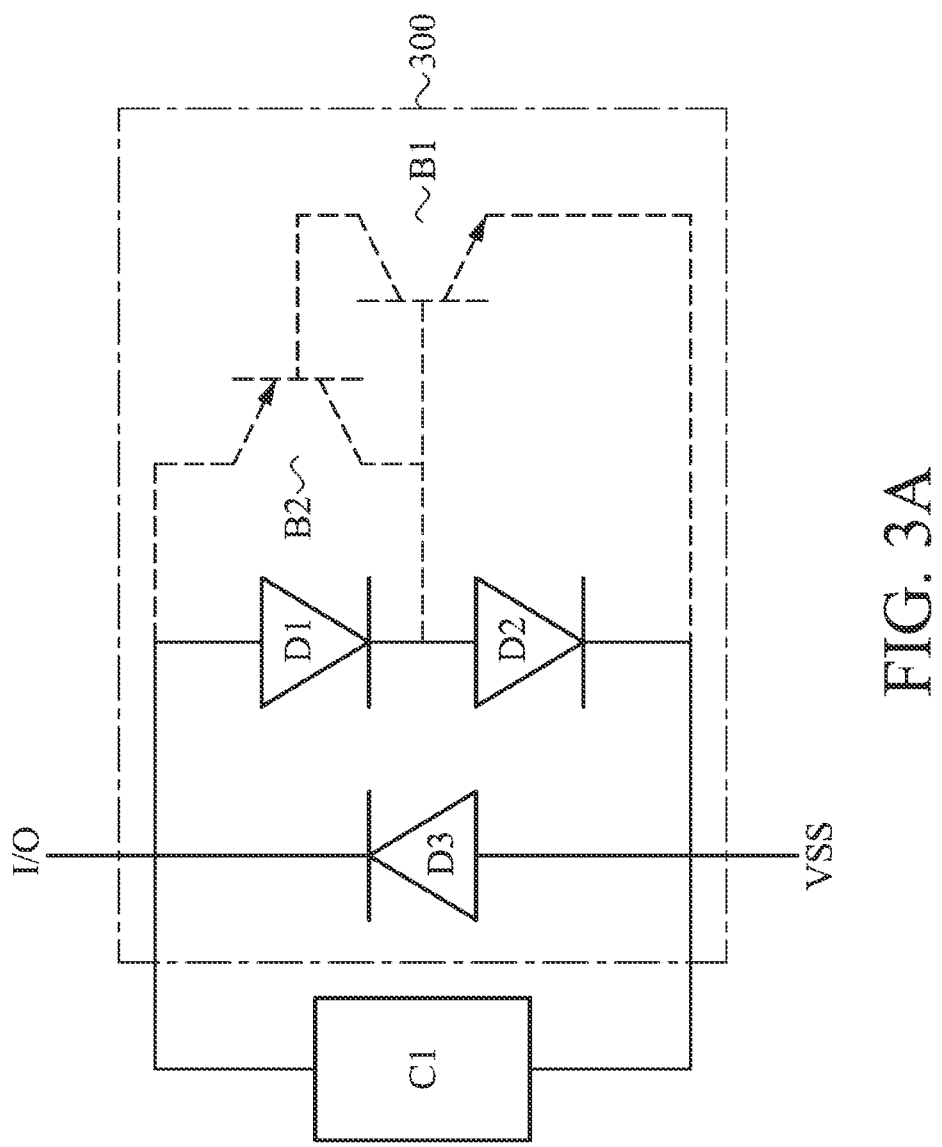
FIG. 3A is an equivalent circuit diagram showing an ESD protection circuit 300 protecting circuit C1.
Figure 3B:
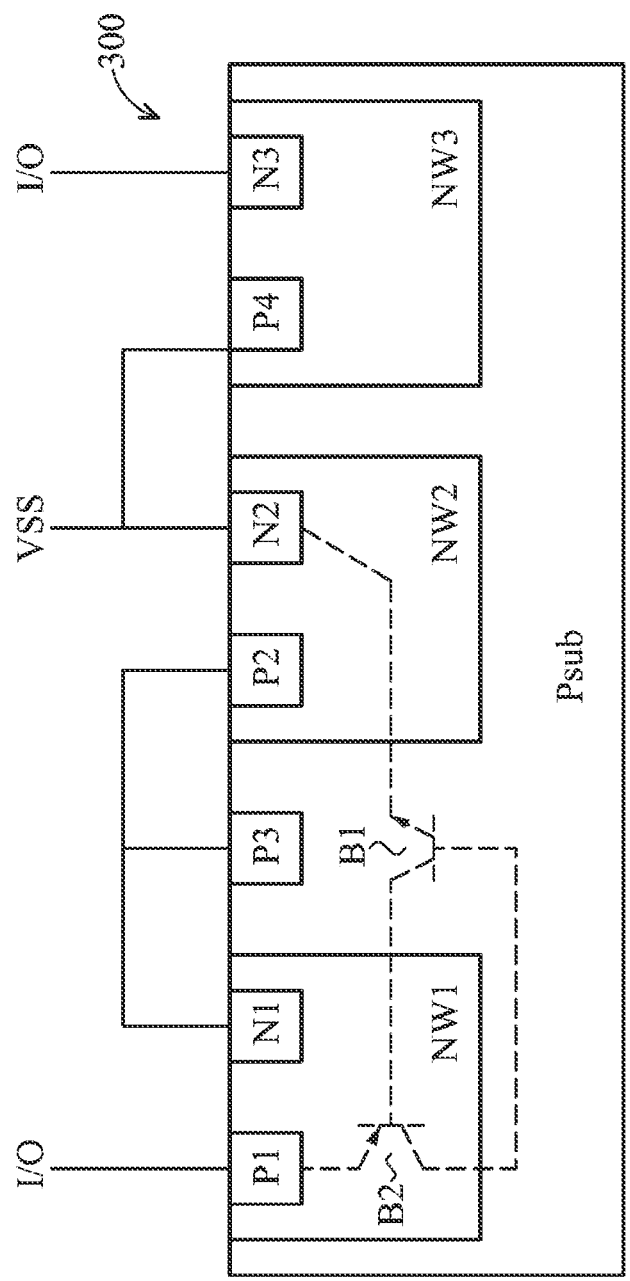
FIG. 3B is a cross-sectional view of the ESD protection circuit 300.

FIG. 3A is another embodiment of an equivalent circuit diagram showing an ESD protection circuit 300 and a circuit C1 under protection. FIG. 3B is a cross-sectional view of the ESD protection circuit 300 in FIG. 3A.

The difference between the embodiment of FIG. 2B and the embodiment of FIG. 3B is that the ESD protection circuit 300 in FIG. 3B further comprises a third N-well NW3. Features that are identical to FIG. 2B will not be described repeatedly. The third N-well NW3 comprises a fourth P-doped region P4 and a third N-doped N3, forming a third diode D3 as shown in FIG. 3A. The fourth P-doped region P4 is electrically connected to the second N-doped region N2 and the reference voltage node VSS. The third N-doped region N3 is electrically connected to the input/output terminal I/O.

The ESD protection circuit 300 is in parallel with the circuit C1 under protection, as shown in FIG. 3A. Two nodes of the circuit C1 under protection are connected to the input/output terminal I/O and the reference voltage node VSS respectively. The cathode of the third diode D3 is electrically connected to the input/output terminal I/O, and the anode of the third diode D3 is electrically connected to the reference voltage node VSS.

When an ESD event occurs between the input/output terminal I/O and the reference voltage node VSS, the voltage level of the reference voltage node VSS may be smaller or larger than the voltage level of the input/output terminal I/O. When the voltage level of the reference voltage node VSS is larger than the voltage level of the input/output terminal I/O, the third diode D3 is forward biased to form a current path to discharge the electrostatic charges away from the circuit C1 under protection. When the voltage level of the reference voltage node VSS is smaller than the voltage level of the input/output terminal I/O, the first and second diodes D1 and D2 are forward biased and forming a current path to discharge the electrostatic charges away from the circuit C1 under protection, which is identical to the embodiment of FIGS. 2A and 2B.

Figure 4A:
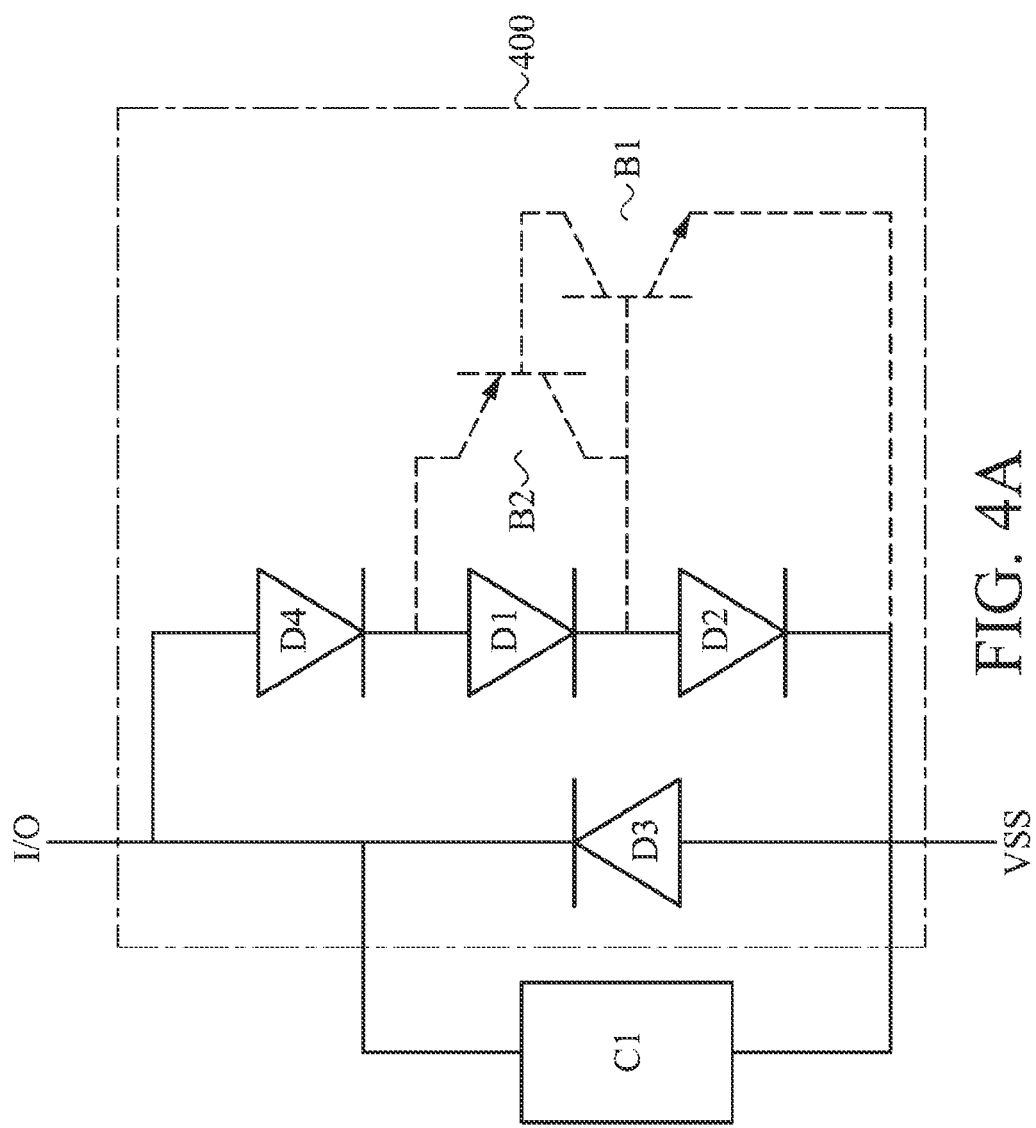
FIG. 4A is an equivalent circuit diagram showing an ESD protection circuit 400 protecting circuit C1.
Figure 4B:
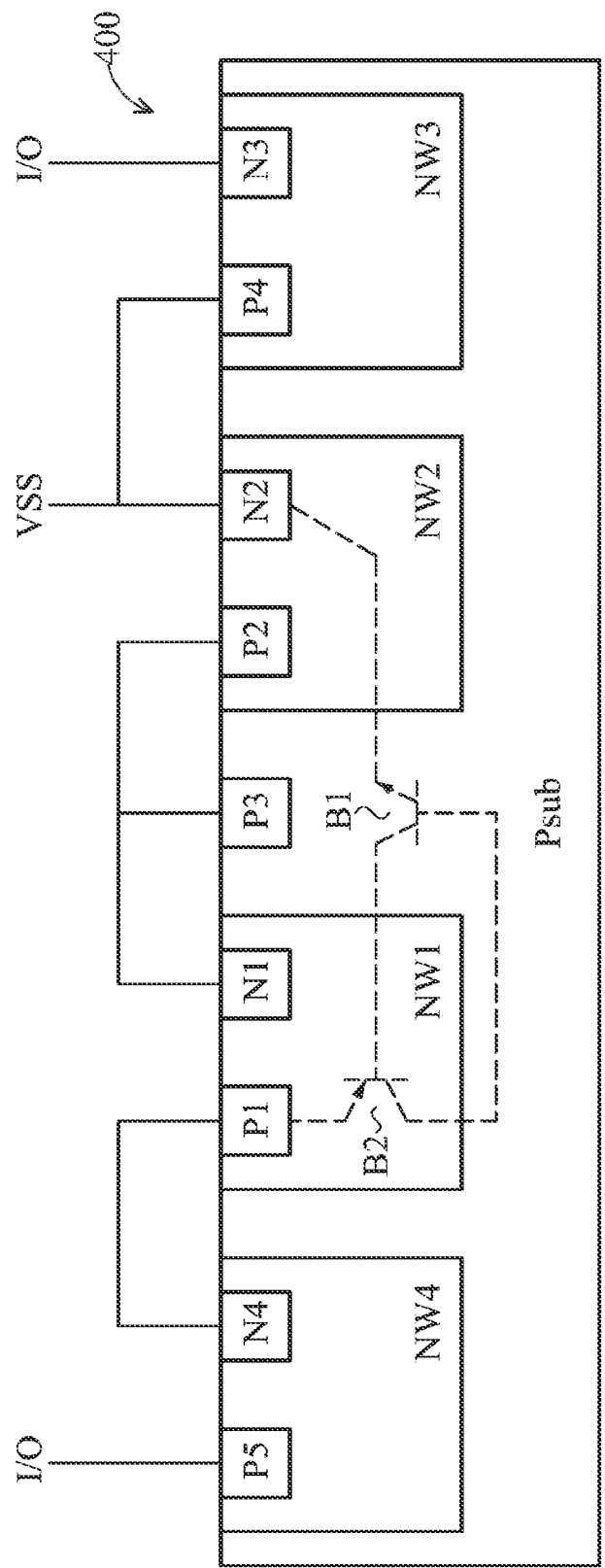
FIG. 4B is a cross-sectional view of the ESD protection circuit 400.

The embodiment of FIGS. 4A and 4B is a further application of the embodiment of FIGS. 3A and 3B. An ESD protection circuit 400 in the embodiment with a different activation voltage is shown to fit the demands of the circuit C1 under protection. The embodiment of FIG. 4A is the embodiment of FIG. 3A plus an additional fourth diode D4 disposed between the first diode D1 and the input/output terminal I/O, such that a diode series is formed by the fourth diode D4, the second diode D2 and the first diode D1 connected in series between the input/output terminal I/O and the reference voltage node VSS. The diode series in the ESD protection circuit 400 provides a larger activation voltage (which is increased by the threshold voltage of the fourth diode D4). The cathode of the fourth diode D4 is connected to the anode of the first diode D1, and the anode of the fourth diode D4 is connected to the input/output terminal I/O. It should be noted that the anode of the first diode D1 in this embodiment is connected to the cathode of the fourth diode D4 rather than the input/output terminal I/O. In the embodiment as shown in FIG. 4B, a fourth N-doped region N4 and a fifth P-doped region P5 are formed in the fourth N-well NW4, and the fourth N-doped region N4, the fifth P-doped region P5, and the fourth N-well NW4 form the fourth diode D4. As shown in FIG. 4B, the first P-doped region P1 is electrically connected to the fourth N-doped region N4 in the fourth N-well NW4, and the fifth P-doped region P5 is electrically connected to the input/output terminal I/O.

Figure 5A:
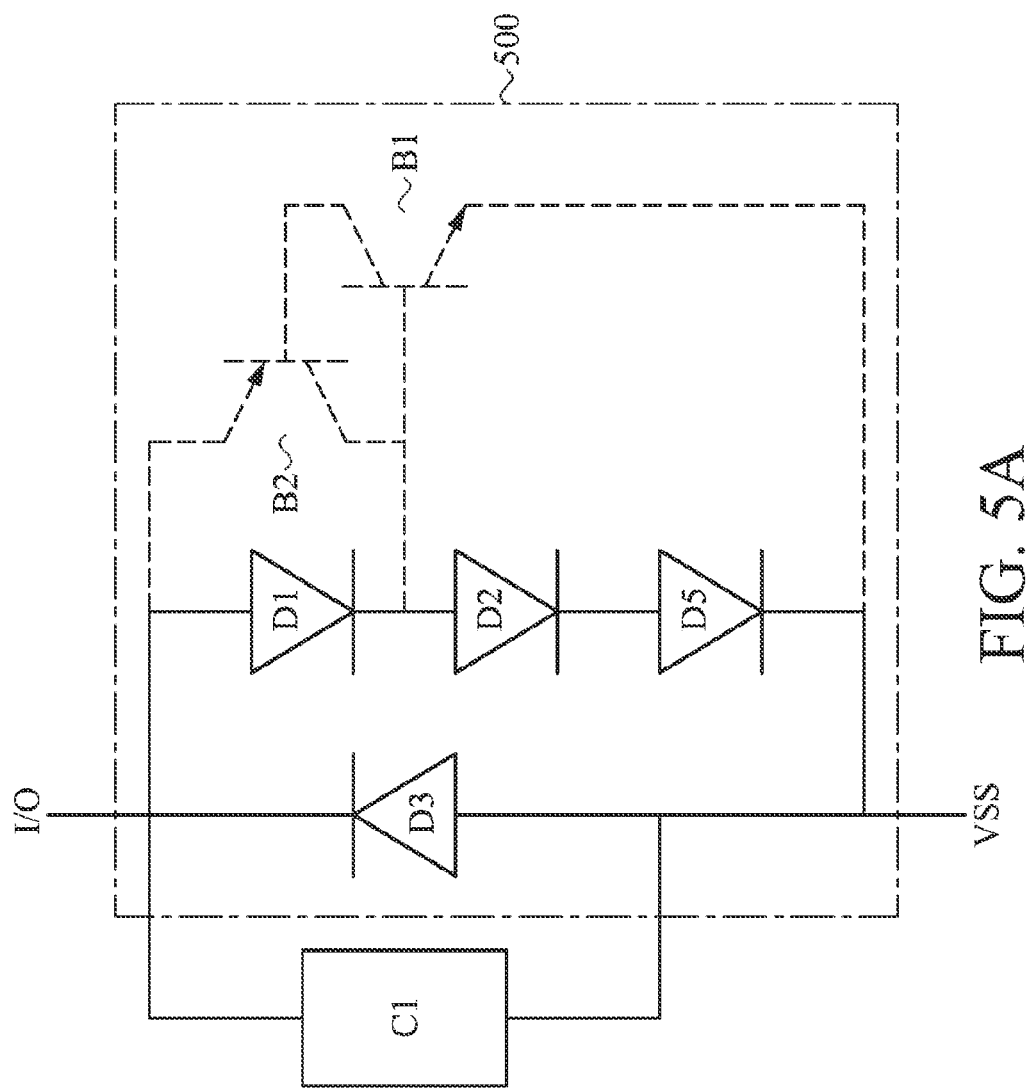
FIG. 5A is an equivalent circuit diagram showing an ESD protection circuit 500 protecting circuit C1.
Figure 5B:
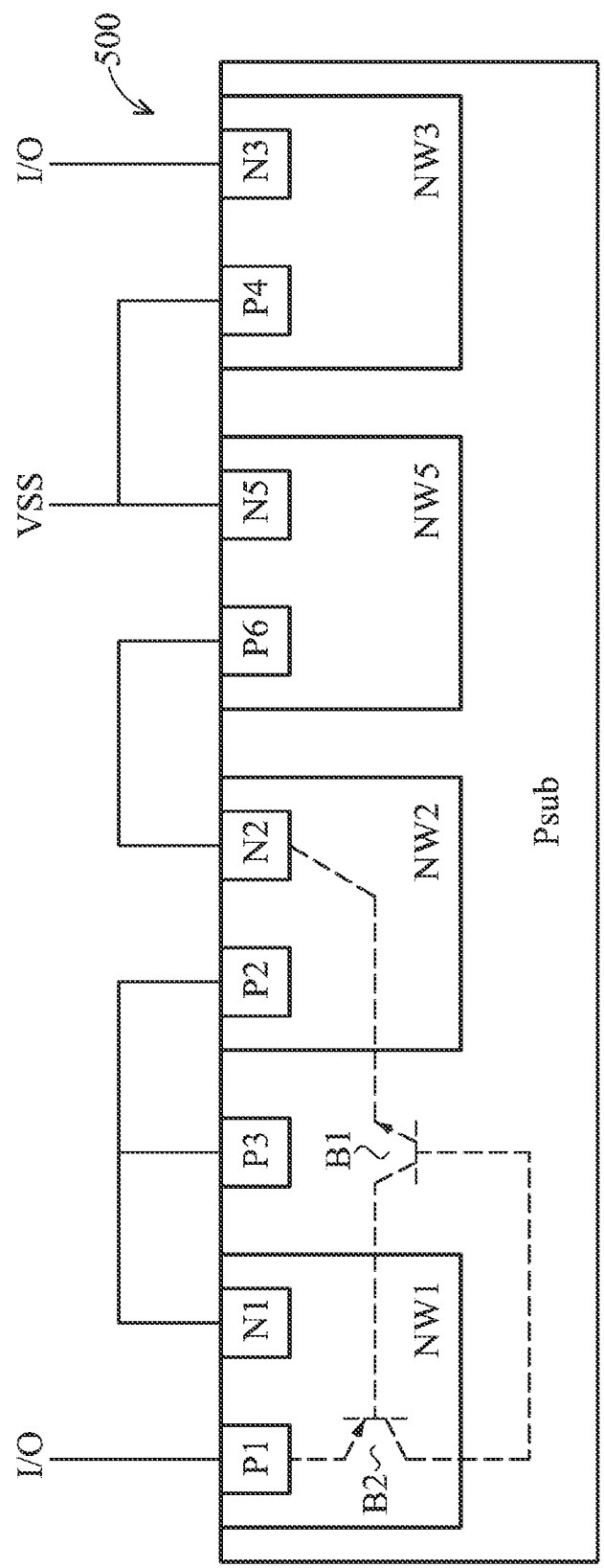
FIG. 5B is a cross-sectional view of the ESD protection circuit 500.

The embodiment of FIGS. 5A and 5B is another further application of the embodiment of FIGS. 3A and 3B. An ESD protection circuit 500 in the embodiment with a different activation voltage is shown to fit the demands of the circuit C1 under protection. The embodiment of FIG. 5A is the embodiment of FIG. 3A plus an additional fifth diode D5 between the second diode D2 and the reference voltage node VSS, such that a diode series is formed by the first diode D1, the second diode D2 and the fifth diode D5 connected in series between the input/output terminal I/O and the reference voltage node VSS. The diode series in the ESD protection circuit 500 provides a larger activation voltage (which is increased by the threshold voltage of the fifth diode D5). The anode of the fifth diode D5 is connected to the cathode of the second diode D2, and the cathode of the fifth diode D5 is connected to the reference voltage node VSS. It should be noticed that the cathode of the second diode D2 in this embodiment is connected to the anode of the fifth diode D5 rather than the reference voltage node VSS, and the anode of the third diode D3 is connected to the cathode of the fifth diode D5 rather than the cathode of the second diode D2. In the embodiment as shown in FIG. 5B. A fifth N-doped region N5 and a sixth P-doped region P6 are formed in the fifth N-well NW5, and the fifth N-doped region N5, the sixth P-doped region P6, and the fifth N-well NW5 constitute the fifth diode D5. As shown in FIG. 5B, the second N-doped region N2 is electrically connected to the sixth P-doped region P6 in the fifth N-well NW5, and the fifth N-doped region N5 in the fifth N-well NW5 is electrically connected to the fourth P-doped region P4 and the reference voltage node VSS.

Figure 6A:
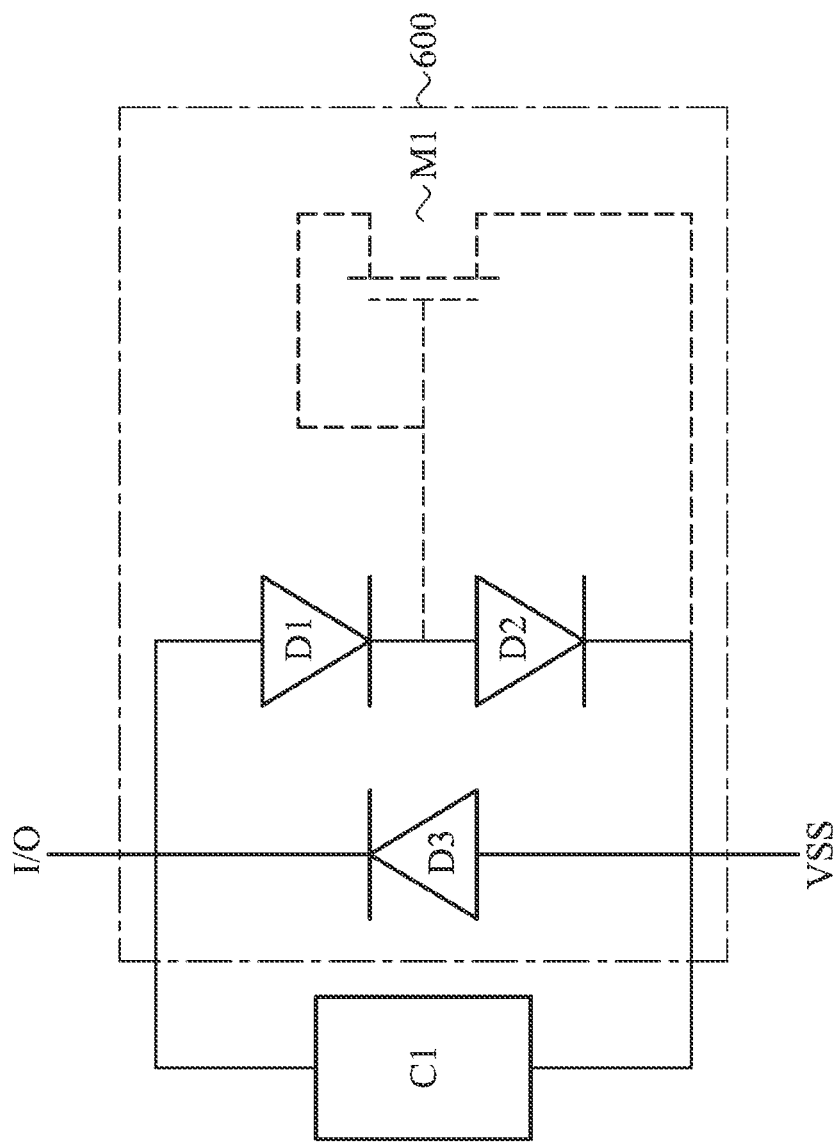
FIG. 6A is an equivalent circuit diagram showing an ESD protection circuit 600 protecting circuit C1.
Figure 6B:
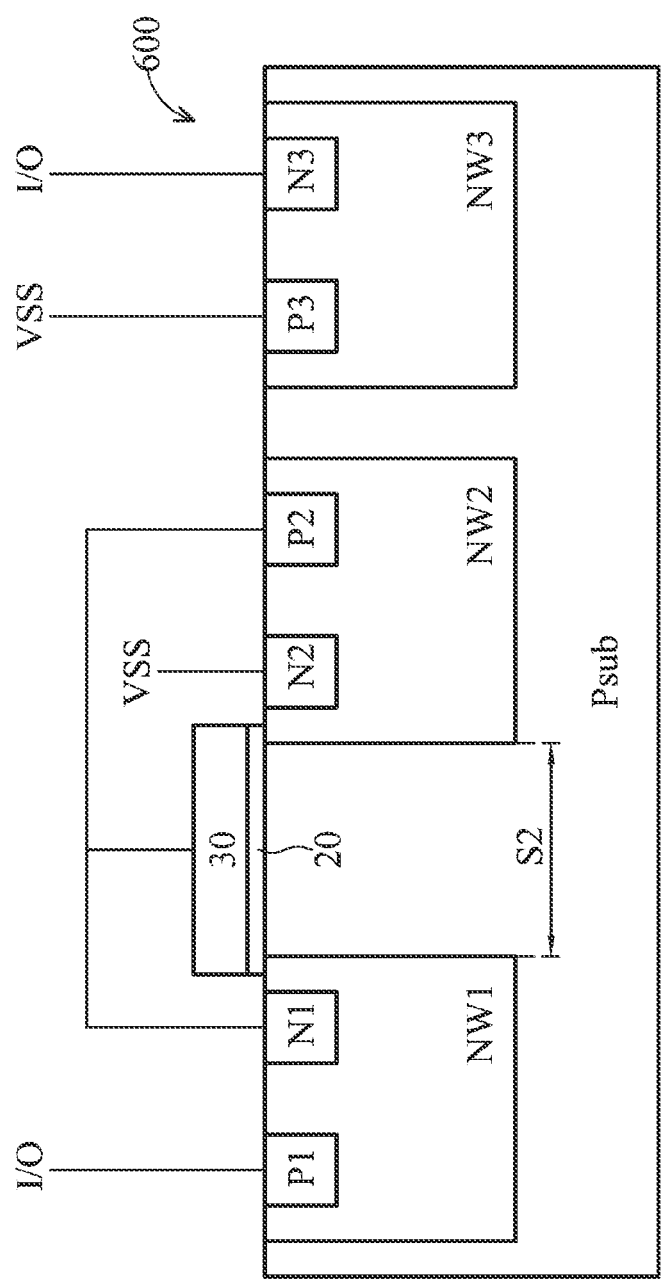
FIG. 6B is a cross-sectional view of the ESD protection circuit 600.

FIG. 6A is an equivalent circuit diagram showing an ESD protection circuit 600 protecting circuit C1 in another embodiment of the invention. FIG. 6B is a cross-sectional view of the ESD protection circuit 600 shown in FIG. 6A.

Referring to FIG. 6B, the ESD protection circuit 600 comprises a P-type substrate Psub, a first N-well NW1, a second N-well NW2, a third N-well NW3, and a gate structure. The first N-well NW1, the second N-well NW2, and the third N-well NW3 are formed in the P-type substrate Psub. Each of the first to third N-wells NW1 to NW3 comprises a pair of high doping regions with opposite doping types. The first N-well NW1 comprises a first P-doped region P1 and a first N-doped region N1, and the first P-doped region P1 and the first N-doped region N1 form a first diode D1; the second N-well NW2 comprises a second P-doped region P2 and a second N-doped region N2, and the second P-doped region P2 and the second N-doped region N2 form a second diode D2; and third N-well N3 comprises a third P-doped region P3 and a third N-doped region N3, and the third P-doped region P3 and the third N-doped region N3 form a third diode D3, as shown in FIG. 6A. The gate structure comprises a gate dielectric 20 and a gate electrode 30, as shown in FIG. 6B. The gate structure is formed on the P-type substrate Psub and is disposed between the first N-well NW1 and the second N-well NW2. In one embodiment, the gate structure may partially overlap with the first N-well NW1 and the second N-well NW2 to form a parasitic MOSFET M1, as shown in FIG. 6A. The channel length of the parasitic MOSFET M1 is equivalent to a distance S2 between the first N-well NW1 and the second N-well NW2. The longer the distance S2, the smaller the parasitic effect is and the parasitic MOSFET M1 may not function properly. In a preferred embodiment, the distance S2 between the first N-well NW1 and the second N-well NW2 is less than 1 µm.

In FIG. 6B, the first N-doped region N1, the second P-doped region P2, and the gate electrode 30 are electrically connected to each other. The first P-doped region P1 and the third N-doped region N3 are electrically connected to an input/output terminal I/O. The second N-doped region N2 and the third P-doped region P3 are electrically connected to a reference voltage node VSS. The P-type substrate Psub is set as floating, which is not connected to any ground node.

The ESD protection circuit 600 is in parallel with the circuit C1 under protection, as shown in FIG. 6A. Two nodes of the circuit C1 under protection are connected to the input/output terminal I/O and the reference voltage node VSS. The circuit C1 under protection may be but not limited to an integrated circuit formed by VLSI fabrication technology. The first diode D1 and the second diode D2 are connected in series. The anode of the first diode D1 is connected to the input/output terminal I/O, and the cathode of the first diode D1 is connected to the anode of the second diode D2, and the cathode of the second diode D2 is connected to the reference voltage node VSS. The cathode of the third diode D3 is connected to the input/output terminal I/O, and the anode of the third diode D3 is connected to the reference voltage node VSS. The gate and the drain of the parasitic MOSFET M1 are both connected to the anode of the first diode D1 and the cathode of the second diode D2. The source of the parasitic MOSFET M1 is electrically connected to the reference voltage node VSS.

When an ESD event occurs between the input/output terminal I/O and the reference voltage node VSS, the voltage level of the reference voltage node VSS may be smaller or larger than the voltage level of the input/output terminal I/O. When the voltage level of the reference voltage node VSS is larger than the voltage level of the input/output terminal I/O, the third diode D3 is forward biased to form a current path to discharge the electrostatic charges away from the circuit C1 under protection. When the voltage level of the reference voltage node VSS is smaller than the voltage level of the input/output terminal I/O, the first diode D1 and second diode D2 are forward biased and form a current path to discharge the electrostatic charges away from the circuit C1 under protection. A bias (i.e. threshold voltage of the second diode D2) generated due to the two forward biased diodes D1 and D2 is applied between the gate and the source of the parasitic MOSFET M1 to successively switch the parasitic MOSFET M1 to ON. Thus, an additional current path with lower impedance is formed to discharge electrostatic charges away from the circuit C1 under protection.

The embodiment in FIGS. 6A and 6B utilizes a parasitic MOSFET M1 in parallel with the second diode D2 to effectively reduce the effective impedance of the ESD protection circuit 600, which improves efficiency and reliability.

Figure 7A:
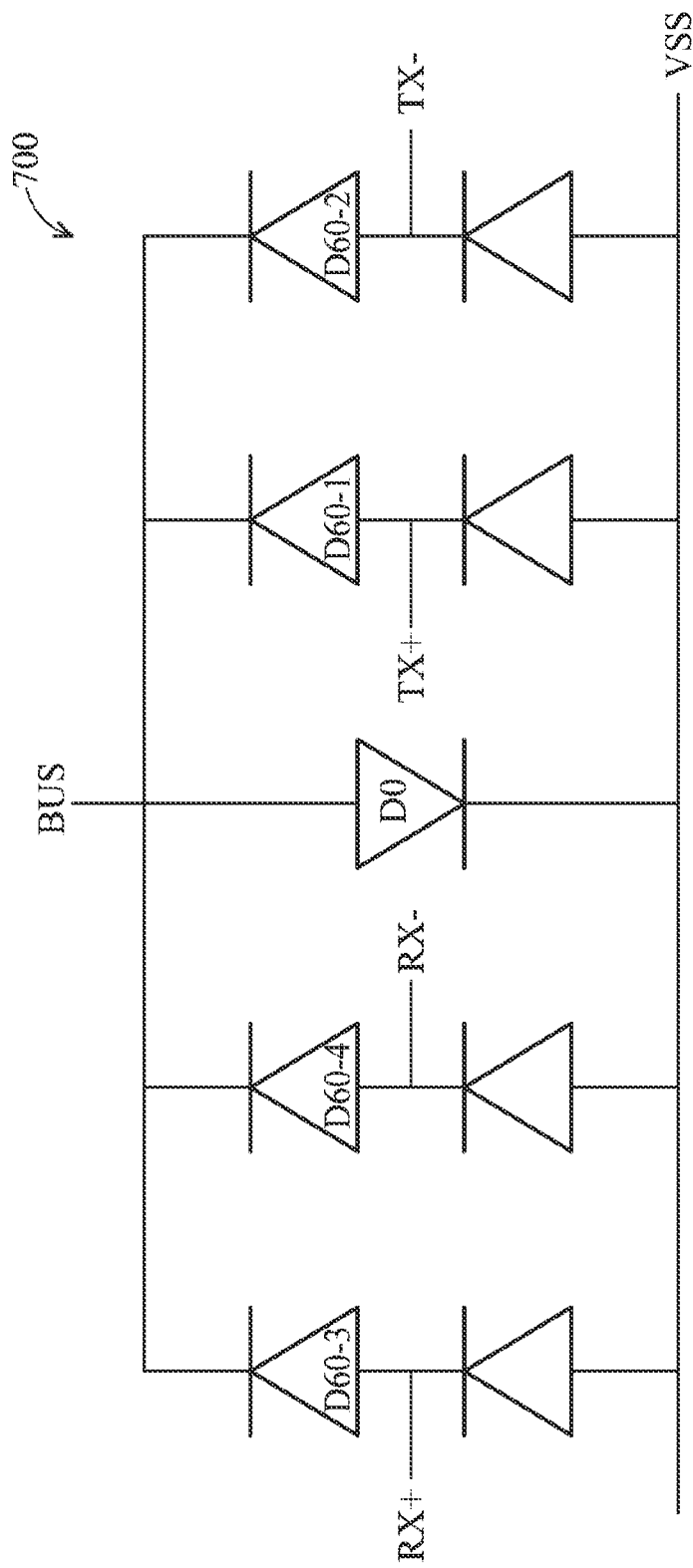
FIG. 7A is an equivalent circuit diagram showing an ESD protection circuit 700.
Figure 7B:
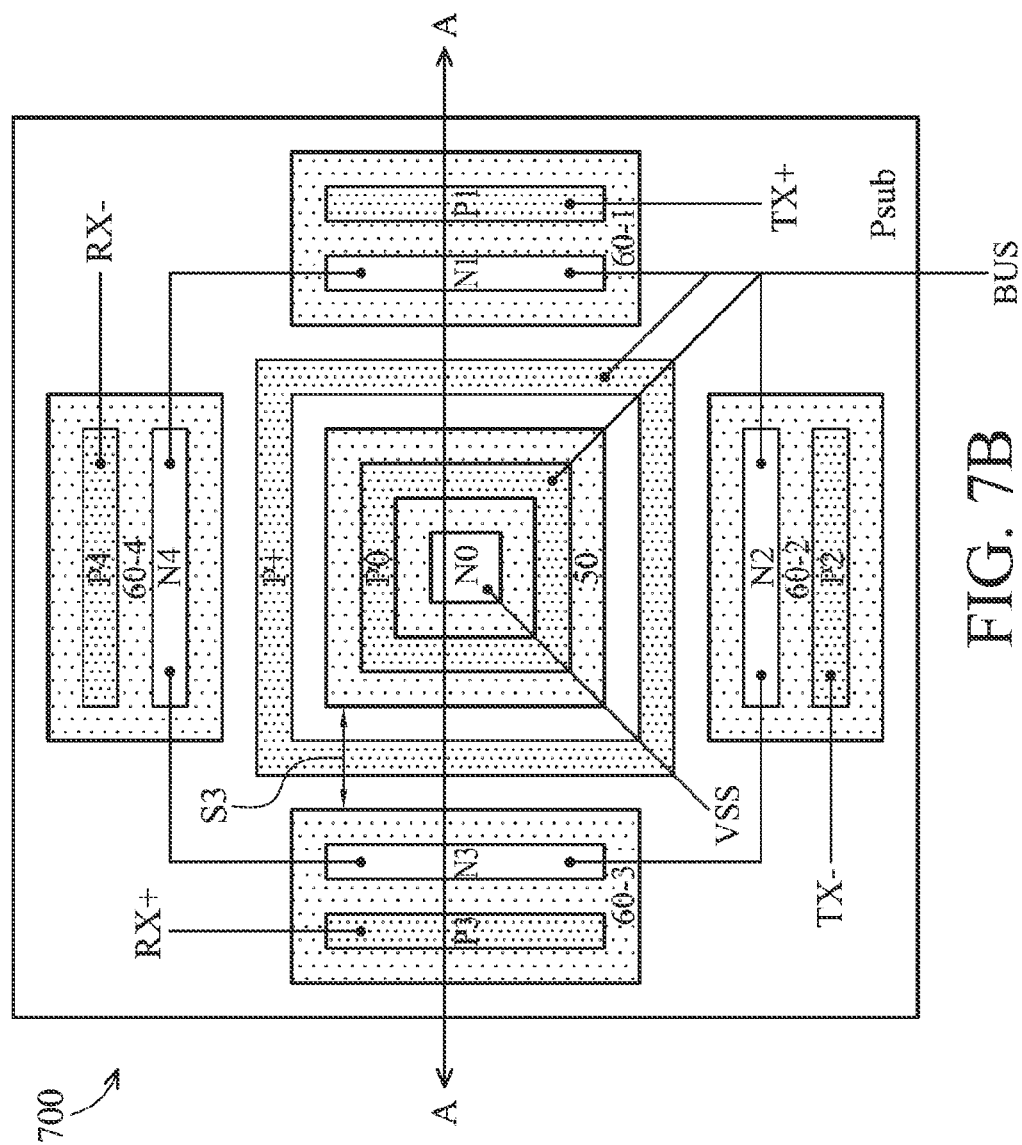
FIG. 7B is a schematic layout view of the ESD protection circuit 700.

An embodiment in FIGS. 7A and 7B showing an ESD protection circuit 700. In this embodiment, the circuit (not shown) under protection, for example, is a USB 3.0 port and comprises four input/output terminals $TX^+$, $TX^-$, $RX^+$, and $RX^-$. If the ESD protection circuit 300 disclosed above is applied to each of the four input/output terminals, the whole ESD protection circuit occupies a significantly large footprint. Therefore, in this embodiment, the ESD protection circuit 700 utilizes a common diode D0 (which is equivalent to the second diode D2 in the embodiment of FIG. 3A) to effectively reduce footprint, as shown in FIG. 7A.

FIG. 7B is a schematic layout view of a portion of the ESD protection circuit 700. The ESD protection circuit 700 comprises a P-type substrate Psub, a common N-well 50, a plurality of peripheral N-wells 60-1 to 60-4, and a circular P-doped region P+. The P-type substrate Psub is set as floating, which is not connected to any ground node. The common N-well 50, the peripheral N-wells 60-1 to 60-4, and the circular P-doped region P+ are formed in the P-type substrate Psub. The peripheral N-wells 60-1 to 60-4 are disposed to surround the common N-well 50, and each of the peripheral N-wells 60-1 to 60-4 comprises an N-doped region (N1 to N4, respectively) and a P-doped region (P1 to P4, respectively), forming diodes D60-1 to D60-4 shown in FIG. 7A. The common N-well 50 comprises a common P-doped region P0 and a common N-doped region N0. The common N-doped region N0 is electrically connected to a reference voltage node VSS. The common P-doped region P0 surrounds the common N-doped region N0, and the common P-doped region P0 and the common N-well 50 form a common diode D0. The circular P-doped region P+ is disposed between the common N-well 50 and the peripheral N-wells 60-1 to 60-4. The circular P-doped region P+ surrounds the common N-well 50. It should be noted that the peripheral N-wells 60-1 to 60-4 are geometrically close to the common N-well 50 to form parasitic BJTs (not shown in FIG. 7B, partially shown in FIG. 7C). In a preferred embodiment, a distance S3 between the peripheral N-wells 60-1 to 60-4 and the common N-well 50 is less than 5 µm.

For clarity of the drawing, the diode (equivalent to the third diode D3 in FIG. 3A) for discharging electrostatic charges when the voltage level of the reference voltage node VSS is larger than the voltage level of the input/output terminal I/O is not shown in FIG. 7B.

Referring to FIG. 7A, anodes of the diodes D60-1 to D60-4 are respectively connected to the input/output terminals $TX^+$, $TX^-$, $RX^+$, and $RX^-$. Referring to FIG. 7B, the N-doped region N1 to N4, the common P-doped region P0 and the circular P-doped region P+ are electrically connected to a bus. The common N-doped region N0 is electrically connected to a reference voltage node VSS. Again referring to FIGS. 7A and 7B, the N-doped regions N1 to N4 in FIG. 7B are the cathodes of the diodes D60-1 to D60-4 in FIG. 7A, respectively. The common N-doped region N0 in FIG. 7B is the cathode of the common diode D0.

When an ESD event occurs between any of the input/output terminals $TX^+$, $TX^-$, $RX^+$, and $RX^-$ and the reference voltage node VSS, and the voltage difference exceeds the activation voltage of the ESD protection circuit 700, the common diode D0 and the corresponding diode D60-1, D60-2, D60-3, or D60-4 are forward biased. A current path is formed to discharge the electrostatic charges away from the circuit C1 under protection. For example, when an ESD event occurs between the input/output terminals $RX^-$ and the reference voltage node VSS, and the voltage difference exceeds the activation voltage of the ESD protection circuit 700, the common diode D0 and the diode D60-4 are forward biased. In this embodiment, the diode D60-1 serves as a discharging path between the input/output terminals $TX^+$ and the reference voltage node VSS; the diode D60-2 serves as a discharging path between the input/output terminals $TX^-$ and the reference voltage node VSS; the diode D60-3 serves as a discharging path between the input/output terminals $RX^+$ and the reference voltage node VSS; and the diode D60-4 serves as a discharging path between the input/output terminals $RX^-$ and the reference voltage node VSS. From the above description, when an ESD event occurs between any of the input/output terminals $TX^+$, $TX^-$, $RX^+$, and $RX^-$ and the reference voltage node VSS, and the voltage difference exceeds the activation voltage of the ESD protection circuit 700, the common diode D0 and the corresponding diode D60-1, D60-2, D60-3, or D60-4 are forward biased. No matter at which input/output terminals the ESD event occurs, the common diode D0 must be forward biased. That is, the common diode D0 is commonly utilized for the input/output terminals $TX^+$, $TX^-$, $RX^+$, and $RX^-$ to discharge the electrostatic charges away from the circuit C1 under protection. In other word, the common diode D0 is utilized as a mutual discharging path of the input/output terminals TX+, TX−, RX+, and RX−.

When any of the diodes D60-1 to D60-4 is forward biased, the corresponding parasitic BJT (not shown in FIG. 7B, partially shown in FIG. 7C) is also triggered to ON, providing an additional current path with lower impedance to discharge the electrostatic charges away from the circuit under protection with a lower holding voltage. Also, the ESD protection circuit 700 provides the advantages of a small footprint and lower cost. For functional details of the ESD protection circuit 700 refer to the embodiment of FIGS. 2A and 2B.

Figure 7C:
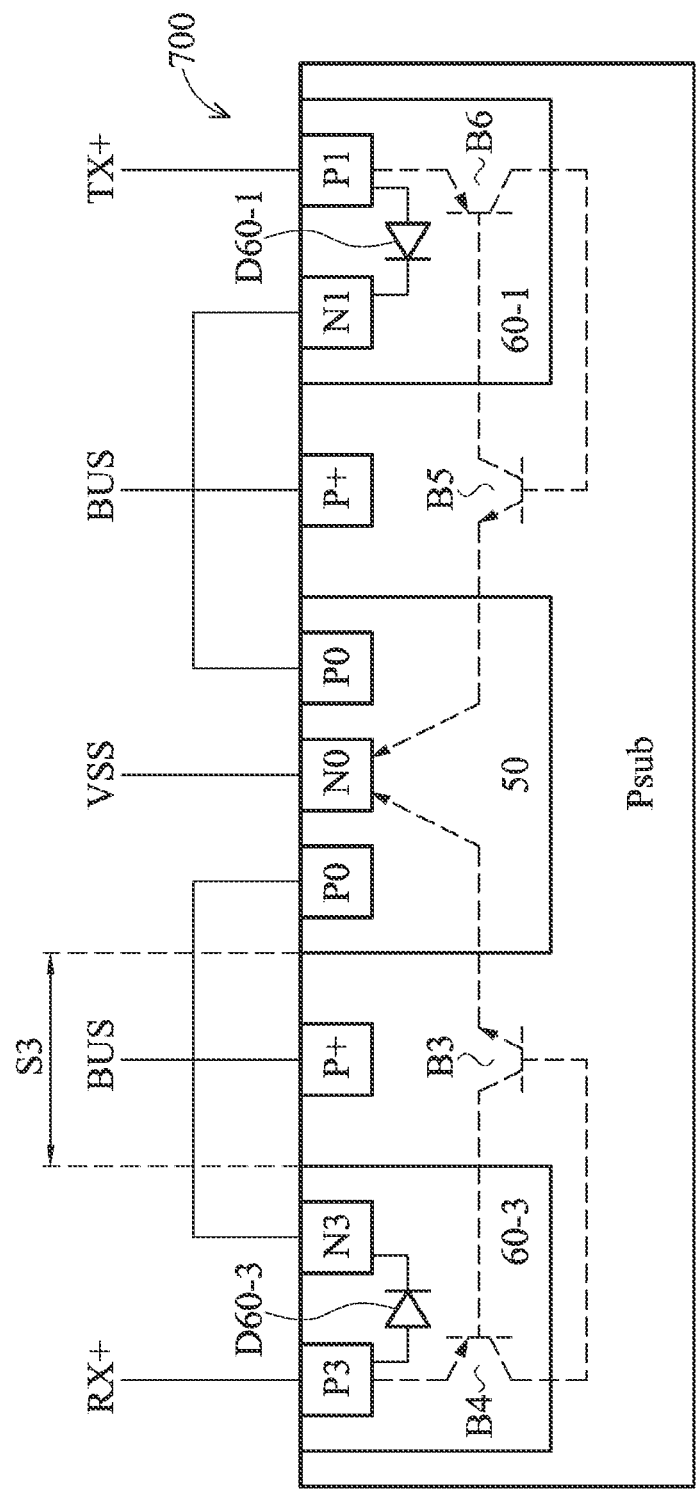
FIG. 7C is a cross-sectional view of the ESD protection circuit 700 along cross section A-A.

FIG. 7C is a cross-sectional view of the ESD protection circuit 700 along cross section A-A. As shown in FIG. 7C, the cross section of the ESD protection circuit 700 comprises the P-type substrate Psub, the peripheral N-wells 60-3 and 60-1, the common N-well 50, and the circular P-doped region P+. The P-type substrate Psub is set as floating, which is not connected to any ground node. The common N-well 50, the peripheral N-wells 60-1 and 60-3, and the circular P-doped region P+ are formed in the P-type substrate Psub. The peripheral N-well 60-3 comprises a P-doped region P3 and an N-doped region N3, forming the diode D60-3 as shown in FIG. 7A. The peripheral N-well 60-1 comprises a P-doped region P1 and an N-doped region N1, forming the diode D60-1 as shown in FIG. 7A. The common N-well 50 comprises a common P-doped region P0 and a common N-doped region N0, forming the common diode D0. The circular P-doped region P+, the common P-doped region P0, and the N-doped region N3 are electrically connected to the bus. The P-doped region P3 is electrically connected to the input/output terminal RX+, and the P-doped region P1 is electrically connected to the input/output terminal TX+.

In one embodiment, the ESD protection circuit 700 is structurally symmetrical. For example, the embodiment in FIG. 7B, the peripheral N-wells 60-1 to 60-4 are symmetrically surrounding the common N-doped region N0. The peripheral N-wells 60-3 and the common N-well 50 is close enough to each other to form two parasitic BJTs B3 and B4, as shown in FIG. 7C. The common N-well 50, the P-type substrate Psub, and the peripheral N-well 60-3 are serving as the emitter, the base, and the collector of the parasitic BJT B3 respectively. The P-doped region P3, the peripheral N-well 60-3, and the P-type substrate Psub are serving as the emitter, the base, and the collector of the parasitic BJT B4 respectively. The collector of the parasitic BJT B3 is electrically connected to the base of the parasitic BJT B4, and the base of the parasitic BJT B3 is electrically connected to the collector of the parasitic BJT B4, as shown in FIG. 7C. According to the above symmetrical disposed peripheral N-wells, the parasitic BJTs B5 and B6 formed by the peripheral N-well 60-1 and the common N-well 50 are similar to the parasitic BJTs B3 and B4. As shown in FIG. 7C, a distance S3 between the peripheral N-well 60-3 and the common N-well 50 is the thickness of the base of the parasitic BJT B3. If the distance S3 is not short enough, the beta gain of the parasitic BJT B3 may be too small to drive the circuit. In a preferred embodiment, the distance S3 between the peripheral N-well 60-3 and the common N-well 50 is less than 5 μm. The peripheral N-wells 60-2 and 60-4 are not shown in FIG. 7C, which form corresponding parasitic BJTs based on the same approach provided above.

Figure 8A:
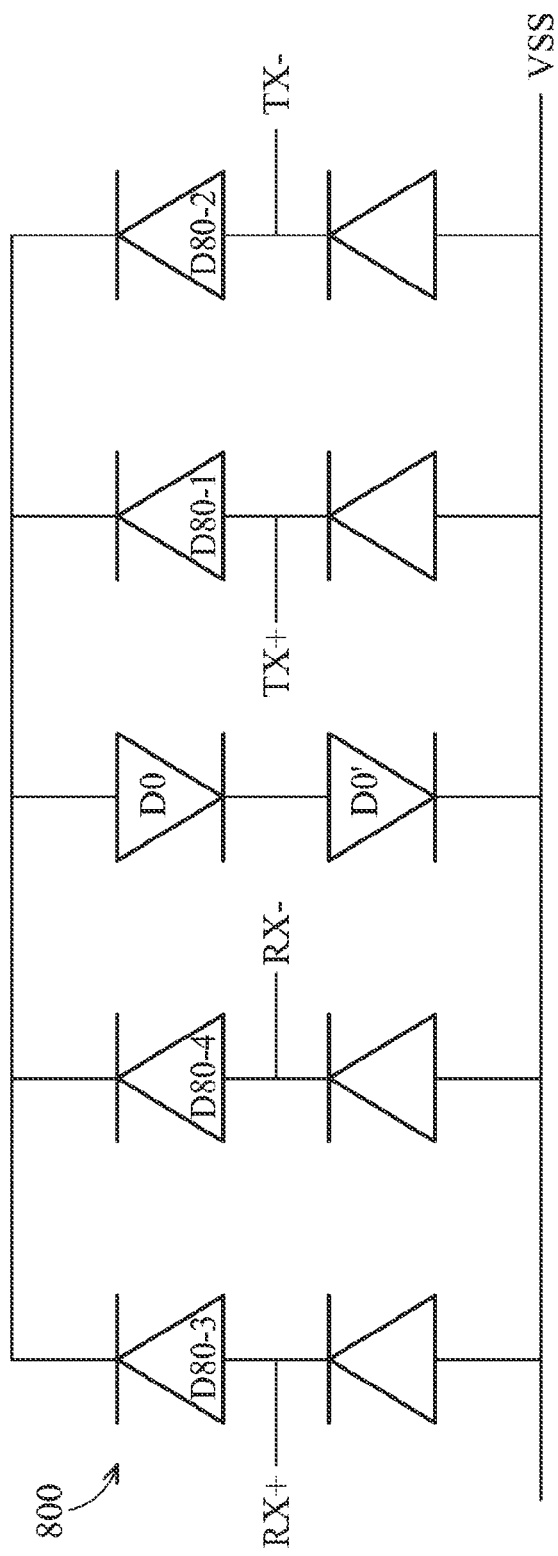
FIG. 8A is an equivalent circuit diagram showing an ESD protection circuit 800.

Another embodiment in FIG. 8A showing an ESD protection circuit 800. In this embodiment, the circuit under protection, for example, is a USB 3.0 port and comprises four input/output terminals TX+, TX−, RX+, and RX−. If the ESD protection circuit 400 as shown in FIG. 4A is applied to each of the four input/output terminals, the whole ESD protection circuit occupies a significantly large footprint. Therefore, in this embodiment, the ESD protection circuit 800 utilizes two common diodes D0 and D0' (which are equivalent to the first diode D1 and the second diode D2 in the embodiment of FIG. 4A) to effectively reduce the footprint, as shown in FIG. 8A.

Figure 8B:
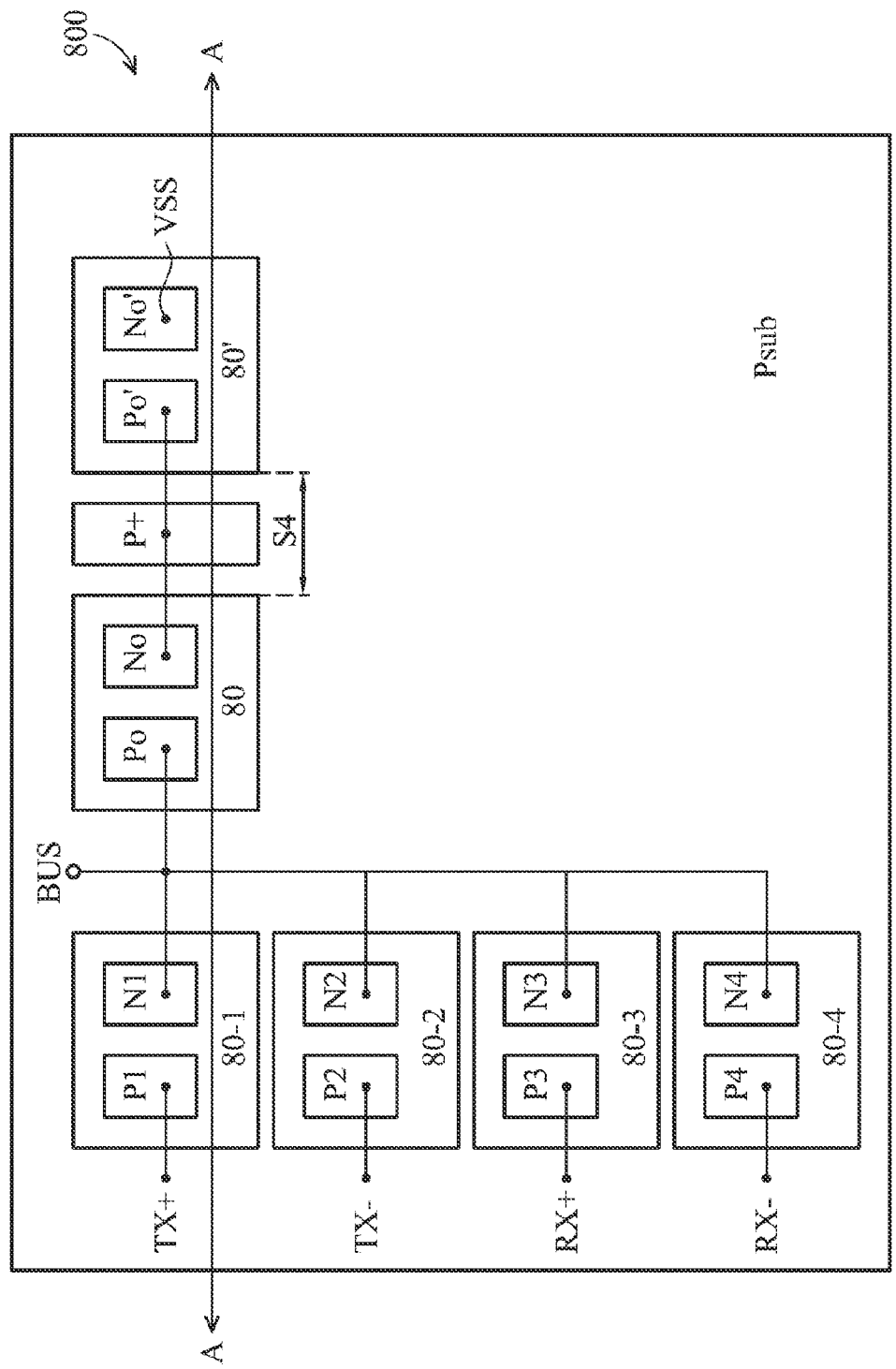
FIG. 8B is a schematic layout view of the ESD protection circuit 800.

FIG. 8B is a schematic layout view of a portion of the ESD protection circuit 800. The ESD protection circuit 800 comprises a P-type substrate Psub, a first common N-well 80, a second common N-well 80', a plurality of peripheral N-wells 80-1 to 80-4, and a circular P-doped region P+. The P-type substrate Psub is set as floating, which is not connected to any ground node. The first common N-well 80, the second common N-well 80', the peripheral N-wells 80-1 to 80-4, and the circular P-doped region P+ are formed in the P-type substrate Psub. Each of the peripheral N-wells 80-1 to 80-4 comprises a N-doped region (N1 to N4, respectively) and a P-doped region (P1 to P4, respectively), forming diodes D80-1 to D80-4, as shown in FIG. 8A.

A first common P-doped region P0 is formed in the first common N-well 80 to form the common diode D0 and a second common N-doped region N0' is formed in the second common N-well 80' to form the second common diode D0' as shown in FIG. 8A. It should be noted that a distance S4 between the first common N-well 80 and the second common N-well 80' should be short enough to form parasitic BJTs (not shown in FIG. 8B, partially shown in FIG. 8C). In a preferred embodiment, the distance S4 between the first common N-well 80 and the second common N-well 80' is less than 5 μm.

For clarity of the drawing, the diode (equivalent to the third diode D3 in FIG. 4A) for discharging electrostatic charges when the voltage level of the reference voltage node VSS is larger than the voltage level of the input/output terminal I/O is not shown in FIG. 8B.

Referring to FIG. 8B, a first common N-doped region N0 is formed in the first common N-well 80, and a second common N-doped region N0' is formed on the first common N-well 80'. The N-doped regions N1 to N4, the first common P-doped region P0 are electrically connected to a bus. The second common N-doped region N0' is electrically connected to the reference voltage node VSS. The first N-doped region N0, the common P-doped region P+ and the second common P-doped region P0' are electrically connected to each other.

Referring to FIG. 8A, anodes of the diodes D80-1 to D80-4 are respectively connected to the input/output terminals TX+, TX−, RX+, and RX−, and cathodes of the diodes D80-1 to D80-4 are respectively connected to the bus. Please referring to FIG. 8B, the N-doped regions N1 to N4 are the cathodes of the diodes D80-1 to D80-4 in FIG. 8A, respectively. The P-doped regions P1 to P4 are the anodes of the diodes D80-1 to D80-4 in FIG. 8A, respectively. The first common N-doped region N0 and the first common P-doped region P0 are the cathode and the anode of the common diode D0, respectively. The second common N-doped region N0' and the second common P-doped region P0' are the cathode and the anode of the second common diode D0', respectively.

When an ESD event occurs between any of the input/output terminals TX+, TX−, RX+, and RX− and the reference voltage node VSS, and the voltage difference exceeds the activation voltage of the ESD protection circuit 800, the first common diode D0, the second common diode D0', and the corresponding diode D80-1, D80-2, D80-3 or D80-4 are forward biased. A current path is formed to discharge the electrostatic charges away from the circuit under protection. For example, when an ESD event occurs between the input/output terminals TX+ and the reference voltage node VSS, and the voltage difference exceeds the activation voltage of the ESD protection circuit 800, the first common diode D0, the second common diode D0' and the diode D80-1 are forward biased. In this embodiment, the diode D80-1 serves as a discharging path between the input/output terminals TX$^+$ and the reference voltage node VSS; the diode D80-2 serves as a discharging path between the input/output terminals TX$^-$ and the reference voltage node VSS; the diode D80-3 serves as a discharging path between the input/output terminals RX$^+$ and the reference voltage node VSS; the diode D80-4 serves as a discharging path between the input/output terminals RX$^-$ and the reference voltage node VSS. From the above description, when an ESD event occurs between any of the input/output terminals TX$^+$, TX$^-$, RX$^+$, and RX$^-$ and the reference voltage node VSS, and the voltage difference exceeds the activation voltage of the ESD protection circuit 800, the first common diode D0, the second common diode D0' and the corresponding diode D60-1, D60-2, D60-3, or D60-4 are forward biased. No matter at which input/output terminals the ESD event occurs, the first common diode D0 and the second common diode D0' must be forward biased. In this embodiment, the first common diode D0 and the second common diode D0' are mutual discharging paths of the input/output terminals TX$^+$, TX$^-$, RX$^+$, and RX$^-$.

When the first common diode D0, the second common diode D0', and any of the diodes D80-1 to D80-4 are forward biased, the parasitic BJT (not shown in FIG. 8B, partially shown in FIG. 8C) is also triggered to ON, providing an additional current path with lower impedance to discharge the electrostatic charges away from the circuit under protection with a lower holding voltage. Also, the ESD protection circuit 800 provides the advantages of a small footprint and lower cost. For functional details of the ESD protection circuit 800 refer to the embodiment of FIGS. 5A and 5B.

Figure 8C:
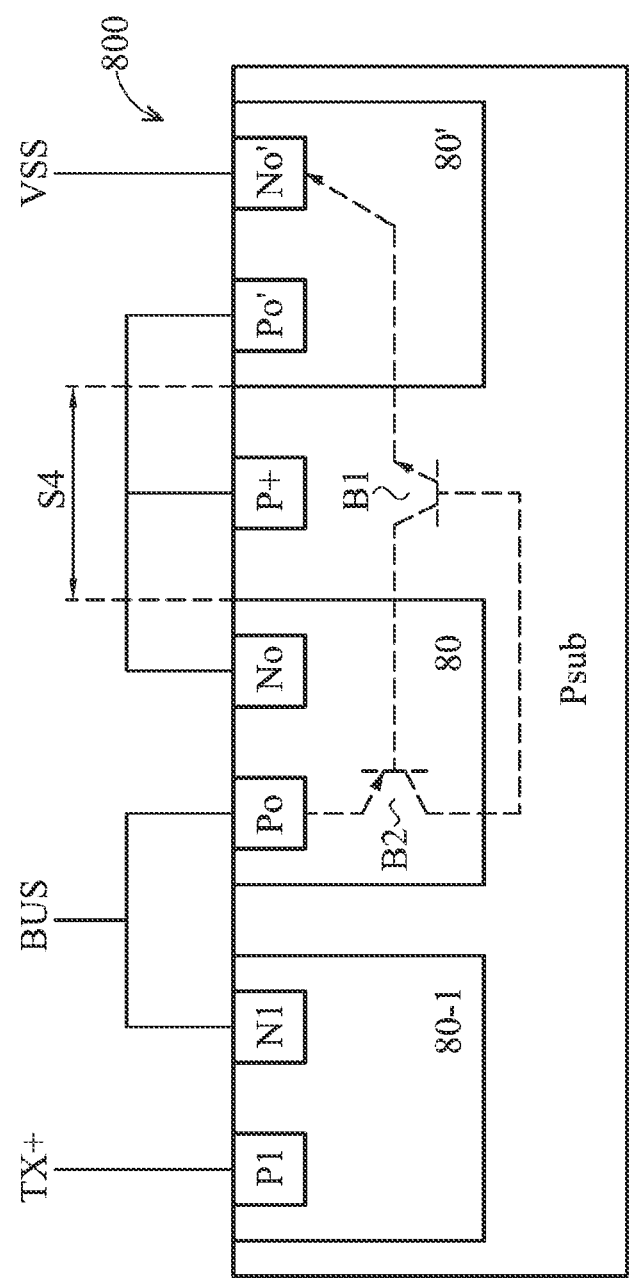
FIG. 8C is a cross sectional view of the ESD protection circuit 800 along cross section A-A.

FIG. 8C is a cross-sectional view of the ESD protection circuit 800 along cross section A-A. As shown in FIG. 8C, the ESD protection circuit 800 comprises the P-type substrate Psub, the peripheral N-well 80-1, the first common N-well 80, the second common N-well 80', and the common P-doped region P+. The P-type substrate Psub is set as floating, which is not connected to any ground node. The peripheral N-well 80-1, the first common N-well 80, the second common N-well 80', and the common P-doped region P+ are formed in the P-type substrate Psub. The peripheral N-well 80-1 comprises a P-doped region P1 and an N-doped region N1, forming the diode D80-1 as shown in FIG. 8A. The P-doped region P1 is electrically connected to the input/output terminal TX$^+$. The N-doped region N1 and the first common P-doped region P0 are electrically connected to the bus. The first N-doped region N0, the common P-doped region P+ and the second common P-doped region P0' are electrically connected to each other. The second common N-doped region N0' is electrically connected to the reference voltage node VSS.

In one embodiment, the first common N-well 80 and the second common N-well 80' of the ESD protection circuit 800 is close enough to each other to form two parasitic BJTs B1 and B2, as shown in FIG. 8C. A distance S4 between the first common N-well 80 and the second common N-well 80' is regarded as the thickness of the base of the parasitic BJT B1. If the distance S4 is not short enough, the beta gain of the parasitic BJT B1 may be too small to drive the circuit. In a preferred embodiment, the distance S4 between the first common N-well 80 and the second common N-well 80' is less than 5 μm. The second common N-well 80', the P-type substrate Psub, and the first common N-well 80 are serving as the emitter, the base, and the collector of the parasitic BJT B1. The first common P-doped region P0, the first common N-well 80, and the P-type substrate Psub are serving as the emitter, the base, and the collector of the parasitic BJT B2. The collector of the parasitic BJT B1 is electrically connected to the base of the parasitic BJT B2, and the base of the parasitic BJT B1 is electrically connected to the collector of the parasitic BJT B2, as shown in FIG. 8C.

The ESD protection devices disclosed in the invention provide lower activation voltages, holding voltage and impedance by triggering parasitic devices, to prevent damage causing by the high ESD voltage drop and to increase the efficiency of electrostatic discharging. Further, the ESD devices of the invention are set as floating and the diodes are separated by individual N-wells, and no Darling Effect is induced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device, comprising:
    a P-type substrate set as floating;
    a common N-well formed in the P-type substrate;
    a common N-doped region formed in the first common N-well, wherein the common N-doped region is electrically connected to a reference voltage node;
    a common P-doped region formed in the common N-well, wherein the common P-doped region surrounds the common N-doped region, the common P-doped region and the common N-well form a common diode;
    a plurality of peripheral N-wells formed in the P-type substrate and surrounding the common N-well, each of the peripheral N-wells comprising a P-type doped region and a N-type doped region, wherein the P-type doped region is electrically connected to one of a plurality of I/O terminals; and
    a circular P-doped region formed in the P-type substrate and disposed between the common N-well and the peripheral N-wells, and the circular P-doped region surrounding the common N-well;
    wherein the common P-doped region, the circular P-doped region, and the N-type doped region are electrically connected to a bus.

2. The electrostatic discharge protection device as claimed in claim 1, wherein a distance between any of the peripheral N-wells and the common N-well is less than 5 μm.

3. The electrostatic discharge protection device as claimed in claim 1, wherein any of the peripheral N-wells and the P-type doped region of the any of the peripheral N-wells form a diode.

4. The electrostatic discharge protection device as claimed in claim 1, wherein the common P-type doped region and the common N-type doped region form a common diode, when an electrostatic discharge event occurs between any of the I/O terminals and the reference voltage node, the common diode is forward-biased.

5. The electrostatic discharge protection device as claimed in claim 1, wherein the common N-well, the P-type substrate, and any of the peripheral N-wells form a first parasitic BJT, and the P-type doped region of the any of the peripheral N-wells, the P-type doped region of the any of the peripheral N-well, and the P-type substrate form a second parasitic BJT, when an electrostatic discharge event occurs between any of the I/O terminals and the reference voltage node, the first and the second parasitic BJTs are triggered to ON.

6. The electrostatic discharge protection device as claimed in claim 1, wherein the peripheral N-wells are symmetrically formed in the P-type substrate and the peripheral N-wells sandwich the common N-well.

* * * * *